United States Patent
Huang

(10) Patent No.: US 11,120,718 B2
(45) Date of Patent: Sep. 14, 2021

(54) SHIFT REGISTER UNIT, DRIVING METHOD THEREOF, GATE DRIVING CIRCUIT AND DISPLAY DEVICE

(71) Applicants: BOE TECHNOLOGY GROUP CO., LTD., Beijing (CN); ORDOS YUANSHENG OPTOELECTRONICS CO., LTD., Inner Mongolia (CN)

(72) Inventor: Fei Huang, Beijing (CN)

(73) Assignees: BOE TECHNOLOGY GROUP CO., LTD., Beijing (CN); ORDOS YUANSHENG OPTOELECTRONICS CO., LTD., Inner Mongolia (CN)

( * ) Notice: Subject to any disclaimer, the term of this patent is extended or adjusted under 35 U.S.C. 154(b) by 466 days.

(21) Appl. No.: 16/308,345

(22) PCT Filed: Mar. 1, 2018

(86) PCT No.: PCT/CN2018/077725
§ 371 (c)(1),
(2) Date: Dec. 7, 2018

(87) PCT Pub. No.: WO2018/233316
PCT Pub. Date: Dec. 27, 2018

(65) Prior Publication Data
US 2021/0225231 A1    Jul. 22, 2021

(30) Foreign Application Priority Data
Jun. 21, 2017   (CN) .......................... 201710474351.X

(51) Int. Cl.
*G09G 3/20*    (2006.01)

(52) U.S. Cl.
CPC ....... *G09G 3/20* (2013.01); *G09G 2300/0426* (2013.01); *G09G 2310/0267* (2013.01);
(Continued)

(58) Field of Classification Search
CPC ................. G09G 3/20; G09G 3/3266; G09G 2300/0426; G09G 2310/0267;
(Continued)

(56) References Cited

U.S. PATENT DOCUMENTS 5,157,386 A    10/1992  Uchida et al.
9,916,039 B2 *  3/2018  Gu ....................... G09G 3/2092
(Continued)

FOREIGN PATENT DOCUMENTS

CN    104217693 A    12/2014
CN    104992661 A    10/2015
(Continued)

OTHER PUBLICATIONS

First Office Action for Chinese Application No. 201710474351.X, dated Dec. 12, 2018, 6 Pages.
(Continued)

*Primary Examiner* — Tom V Sheng
(74) *Attorney, Agent, or Firm* — Brooks Kushman P.C.

(57) ABSTRACT

The shift register unit includes a start unit (11), a pull-up node control unit (12), a pull-down node control unit (13), a gate driving signal output unit (14), a first capacitor unit (16), and a pull-up node noise reduction unit (15) connected to a noise reduction control end (NC), a pull-up node (PU) and a low level input end (VSS), and configured to control the pull-up node (PU) to be electrically connected to, or electrically disconnected from, the low level input end (VSS) under the control of the noise reduction control end (NC).

20 Claims, 6 Drawing Sheets

(52) U.S. Cl.
CPC ............... *G09G 2310/0286* (2013.01); *G09G 2310/061* (2013.01); *G09G 2310/08* (2013.01); *G09G 2320/0209* (2013.01)

(58) Field of Classification Search
CPC ..... G09G 2310/0286; G09G 2310/061; G09G 2310/08; G09G 2320/0209
USPC .......................................................... 345/204
See application file for complete search history.

(56) References Cited

U.S. PATENT DOCUMENTS

| | | | | |
|---|---|---|---|---|
| 2016/0307641 | A1* | 10/2016 | Zheng | G09G 3/3677 |
| 2016/0314850 | A1* | 10/2016 | Gu | G11C 19/28 |
| 2017/0032750 | A1* | 2/2017 | Shao | G11C 19/28 |
| 2017/0032752 | A1* | 2/2017 | Huang | G11C 19/28 |
| 2017/0039968 | A1* | 2/2017 | Chen | G09G 3/3677 |
| 2017/0153742 | A1* | 6/2017 | Pang | G09G 3/2096 |
| 2017/0193938 | A1* | 7/2017 | Feng | G11C 19/184 |
| 2017/0199617 | A1* | 7/2017 | Gu | G06F 3/04184 |
| 2018/0122289 | A1* | 5/2018 | Gu | G09G 3/2092 |
| 2018/0197448 | A1* | 7/2018 | Zhang | G09G 3/20 |
| 2018/0226132 | A1* | 8/2018 | Gao | G09G 3/3677 |
| 2018/0286490 | A1* | 10/2018 | Sun | G09G 3/3266 |
| 2018/0335814 | A1* | 11/2018 | Shao | G06F 1/24 |
| 2019/0066568 | A1* | 2/2019 | Wu | G11C 19/184 |
| 2020/0051654 | A1* | 2/2020 | Wang | G09G 3/20 |
| 2020/0242998 | A1* | 7/2020 | Wang | G09G 3/20 |
| 2020/0243034 | A1* | 7/2020 | Gu | G09G 3/3696 |
| 2020/0258464 | A1* | 8/2020 | Wang | H04M 1/0266 |

FOREIGN PATENT DOCUMENTS

| | | |
|---|---|---|
| CN | 105810251 A | 7/2016 |
| CN | 106601181 A | 4/2017 |
| CN | 107068106 A | 8/2017 |
| JP | H06250606 A | 9/1994 |
| KR | 1020140098880 A | 8/2014 |

OTHER PUBLICATIONS

International Search Report and Written Opinion for Application No. PCT/CN2018/077725, dated May 11, 2018, 10 Pages.

* cited by examiner

SHIFT REGISTER UNIT, DRIVING METHOD THEREOF, GATE DRIVING CIRCUIT AND DISPLAY DEVICE

CROSS-REFERENCE TO RELATED APPLICATIONS

This application is the U.S. national phase of PCT Application No. PCT/CN2018/077725 filed on Mar. 1, 2018, which claims priority to Chinese Patent Application No. 201710474351.X filed on Jun. 21, 2017, which are incorporated herein by reference in their entireties.

TECHNICAL FIELD

The present disclosure relates to the field of display driving technology, in particular to a shift register unit, a driving method thereof, a gate driving circuit and a display device.

BACKGROUND

Along with the fierce competition in the industry of liquid crystal panel, how to reduce the manufacture cost of a panel has become a preferred method for manufacturers. A Gate On Array (GOA) circuit is adopted so as to reduce the number of Integrated Circuits (ICs) for the panel, thereby to effectively reduce the manufacture cost. The conventional GOA circuit has such defects as high output noise and insufficient stability, so the noise reduce becomes very important during the design of the GOA circuit.

SUMMARY

In one aspect, the present disclosure provides in some embodiments a shift register unit, including: a start unit connected to a start end and a pull-up node; a pull-up node control unit connected to the pull-up node, a first clock signal input end and a pull-down node; a pull-down node control unit connected to the first clock signal input end, the pull-down node, the start end and the pull-up node; a gate driving signal output unit connected to a second clock signal input end, the pull-up node, the pull-down node, a low level input end and a gate driving signal output end; a first capacitor unit connected between the pull-up node and the gate driving signal output end; and a pull-up node noise reduction unit connected to a noise reduction control end, the pull-up node and the low level input end, and configured to control the pull-up node to be electrically connected to, or electrically disconnected from, the low level input end under the control of the noise reduction control end.

In some possible embodiments of the present disclosure, the shift register unit further includes a second capacitor unit connected between the pull-down node and the low level input end, and configured to maintain a potential at the pull-down node.

In some possible embodiments of the present disclosure, the gate electrode driving signal output unit is configured to control the gate driving signal output end to be electrically connected to the second clock signal input end or the low level input end under the control of the pull-up node and the pull-down node. The shift register unit further includes: a start signal output unit connected to the second clock signal input end, the pull-up node, the pull-down node, the low level input end and a start signal output end, and configured to control the start signal output end to be electrically connected to the second clock signal input end or the low level input end under the control of the pull-up node and the pull-down node; and a third capacitor unit connected between the pull-up node and the start signal output end.

In some possible embodiments of the present disclosure, the noise reduction control end is connected to the pull-down node. The pull-up node noise reduction unit includes a pull-up node noise reduction transistor, a gate electrode of which is connected to the noise reduction control end, a first electrode of which is connected to the pull-up node, and a second electrode of which is connected to the low level input end.

In some possible embodiments of the present disclosure, the gate driving signal output unit includes: a first gate driving signal output transistor, a gate electrode of which is connected to the pull-up node, a first electrode of which is connected to the second clock signal input end, and a second electrode of which is connected to the gate driving signal output end; and a second gate driving signal output transistor, a gate electrode of which is connected to the pull-down node, a first electrode of which is connected to the gate driving signal output end, and a second electrode of which is connected to the low level input end. The start signal output unit includes: a first start signal output transistor, a gate electrode of which is connected to the pull-up node, a first electrode of which is connected to the second clock signal input end, and a second electrode of which is connected to the start signal output end; and a second start signal output transistor, a gate electrode of which is connected to the pull-down node, a first electrode of which is connected to the start signal output end, and a second electrode of which is connected to the low level input end. The second capacitor unit includes: a first output capacitor, a first end of which is connected to the gate electrode of the second gate driving signal output transistor, and a second end of which is connected to the low level input end; and a second output capacitor, a first end of which is connected to the gate electrode of the second start signal output transistor, and a second end of which is connected to the low level input end.

In some possible embodiments of the present disclosure, the pull-up node control unit includes a pull-up control node. The pull-up node control unit is further connected to a high level input end and the low level input end, and configured to, when a high level is applied to the first clock signal input end, control the pull-up control node to be electrically connected to the low level input end, and when the pull-down node is at a high level, control the pull-up control node to be electrically connected to the low level input end and control the pull-up control node to be electrically connected to the pull-up node under the control of the high level input end.

In some possible embodiments of the present disclosure, the pull-up node control unit includes: a first pull-up node control transistor, a gate electrode of which is connected to the first clock signal input end, a first electrode of which is connected to the pull-up control node, and a second electrode of which is connected to the low level input end; a second pull-up node control transistor, a gate electrode of which is connected to the pull-down node, a first electrode of which is connected to the pull-up control node, and a second electrode of which is connected to the low level input end; and a third pull-up node control transistor, a gate electrode of which is connected to the high level input end, a first electrode of which is connected to the pull-up node, and a second electrode of which is connected to the pull-up control node.

In some possible embodiments of the present disclosure, the start unit is configured to control the pull-up node to be at a high level when a high level is applied to the start end. The pull-down node control unit includes a pull-down control node. The pull-down node control unit is further connected to a high level input end and the low level input end, and configured to, when the pull-up node is at a high level, control the pull-down node to be electrically connected to the low level input end, when a high level is applied to the start end, control the pull-down node to be electrically connected to the low level input end, and when a high level is applied to the first clock signal input end, control the pull-down control node to be at a high level and control the pull-down control node to be electrically connected to the pull-down node under the control of the high level input end.

In some possible embodiments of the present disclosure, the pull-down node control unit includes: a first pull-down node control transistor, a gate electrode of which is connected to the pull-up control node, a first electrode of which is connected to the pull-down node, and a second electrode of which is connected to the low level input end; a second pull-down node control transistor, a gate electrode of which is connected to the start end, a first electrode of which is connected to the pull-down node, and a second electrode of which is connected to the low level input end; a third pull-down node control transistor, a gate electrode and a first electrode of which are connected to the first clock signal input end, and a second electrode of which is connected to the pull-down control node; and a fourth pull-down node control transistor, a gate electrode of which is connected to the high level input end, a first electrode of which is connected to the pull-down control node, and a second electrode of which is connected to the pull-down node.

In some possible embodiments of the present disclosure, the shift register unit further includes a resetting unit connected to a resetting end and the pull-down control node, and configured to control a potential at the pull-down control node under the control of the resetting end.

In another aspect, the present disclosure provides in some embodiments a method for driving the above-mentioned shift register unit, including: at a first stage of each display period, applying a low level to each of a first clock signal input end and a second clock signal input end, controlling, by a start unit, a pull-up node to be electrically connected to a start end under the control of the start end so as to enable the start end to charge a first capacitor unit and enable the pull-up node to be at a high level, controlling, by a pull-down node control unit, a pull-down node to be at a low level under the control of the start end and the pull-up node, controlling, by a gate driving signal output unit, a gate driving signal output end to be electrically connected to the second clock signal end under the control of the pull-up node so as to enable the gate driving signal output end to output a low level, and controlling, by a pull-up node noise reduction unit, the pull-up node to be electrically disconnected from a low level input end under the control of a noise reduction control end; at a second stage of each display period, applying a low level to the first clock signal input end and applying a high level to the second clock signal input end so as to enable the first capacitor unit to pull up a potential at the pull-up node in a bootstrapping manner, controlling, by the pull-down node control unit, the pull-down node to be at a low level continuously under the control of the pull-up node, controlling, by the gate driving signal output unit, the gate driving signal output end to be electrically connected to the second clock signal input end under the control of the pull-up node so as to enable the gate driving signal output end to output a high level, and controlling, by the pull-up node noise reduction unit, the pull-up node to be electrically connected to the low level input end under the control of the noise reduction control end; at a third stage of each display period, applying a low level to each of the first clock signal input end and the second clock signal input end so as to enable the potential at the pull-up node to jump to the high level at the first stage due to the effect of the first capacitor unit, controlling, by the pull-down node control unit, the pull-down node to be at a low level continuously under the control of the pull-up node, controlling, by the gate driving signal output end, the gate driving signal output end to be electrically connected to the second clock signal input end under the control of the pull-up node so as to enable the gate driving signal output end to output a low level, and controlling, by the pull-up node noise reduction unit, the pull-up node to be electrically disconnected from the low level input end under the control of the noise reduction control end; at a fourth stage of each display period, applying a high level to the first clock signal input end and applying a low level to the second clock signal input end, controlling, by the pull-up node control unit, the pull-up node to be at a low level under the control of the first clock signal input end, controlling, by the pull-down node control unit, the pull-down node to be at a high level, controlling, by the gate driving signal output unit, the gate driving signal output end to be electrically connected to the low level input end under the control of the pull-down node, and controlling, by the pull-up node noise reduction unit, the pull-up node to be electrically connected to the low level input end under the control of the noise reduction control end; and after the fourth stage, applying a low level and a high level to the first clock signal input end alternately, when the high level is applied to the first clock signal input end, controlling, by the pull-up node control unit, the pull-up node to be at a low level continuously under the control of the first clock signal input end, controlling, by the pull-down node control unit, the pull-down node to be at a low level continuously, controlling, by the gate driving signal output unit, the gate driving signal output end to be electrically connected to the low level input end under the control of the pull-down node, and controlling, by the pull-up node noise reduction unit, the pull-up node to be electrically connected to the low level input end under the control of the noise reduction control end.

In some possible embodiments of the present disclosure, when the shift register unit further includes a resetting unit, each display period further includes a resetting stage prior to the first stage. The method further includes, at the resetting stage, applying a high level to a resetting end, applying a low level to each of the first clock signal input end and the second clock signal input end, controlling, by the resetting unit, the pull-down node to be electrically connected to the resetting end under the control of the resetting end so as to enable the pull-up node to be at a high level, controlling, by the pull-up node control unit, the pull-up node to be at a low level under the control of the pull-down node, controlling, by the gate driving signal output end, the gate driving signal output end to be electrically connected to the second clock signal input end under the control of the pull-up node so as to enable the gate driving signal output end to output a low level, and controlling, by the pull-up node noise reduction unit, the pull-up node to be electrically connected to the low level input end under the control of the noise reduction control end.

In some possible embodiments of the present disclosure, a period of a first clock signal from the first clock signal input end and a period of a second clock signal from the second clock signal input end are each T, a duty ratio of each of the first clock signal and the second clock signal is 1/4, and the first clock signal is delayed by T/2 relative to the second clock signal.

In yet another aspect, the present disclosure provides in some embodiments a gate driving circuit including a plurality of the above-mentioned shift register units connected to each other in a cascaded manner. Apart from a first-level shift register unit, a start end of a current-level shift register unit is connected to a gate driving signal output end of a previous-level shift register unit, or connected to a start signal output end of the previous-level shift register unit.

In still yet another aspect, the present disclosure provides in some embodiments a display device including the above-mentioned gate driving circuit.

BRIEF DESCRIPTION OF THE DRAWINGS

In order to illustrate the technical solutions of the present disclosure or the related art in a clearer manner, the drawings desired for the present disclosure or the related art will be described hereinafter briefly. Obviously, the following drawings merely relate to some embodiments of the present disclosure, and based on these drawings, a person skilled in the art may obtain the other drawings without any creative effort.

DETAILED DESCRIPTION

The present disclosure will be described hereinafter in conjunction with the drawings and embodiments. The following embodiments are for illustrative purposes only, but shall not be used to limit the scope of the present disclosure.

In order to make the objects, the technical solutions and the advantages of the present disclosure more apparent, the present disclosure will be described hereinafter in a clear and complete manner in conjunction with the drawings and embodiments. Obviously, the following embodiments merely relate to a part of, rather than all of, the embodiments of the present disclosure, and based on these embodiments, a person skilled in the art may, without any creative effort, obtain the other embodiments, which also fall within the scope of the present disclosure.

All transistors adopted in the embodiments of the present disclosure may be thin film transistors (TFTs), field-effect transistors (FETs) or any other elements having a same characteristic. In the embodiments of the present disclosure, in order to differentiate two electrodes other than a gate electrode from each other, one of the two electrodes is called as a first electrode, and the other is called as a second electrode. In actual use, the first electrode may be a drain electrode while the second electrode may be a source electrode, or the first electrode may be a source electrode while the second electrode may be a drain electrode.

A main object of the present disclosure is to provide a shift register unit, a driving method, a gate driving circuit and a display device, so as to output a gate driving signal in a stable and efficient manner as compared with the related art where it is impossible for the shift register unit to perform noise reduction on a pull-up node and a gate driving signal output end.

Figure 2:
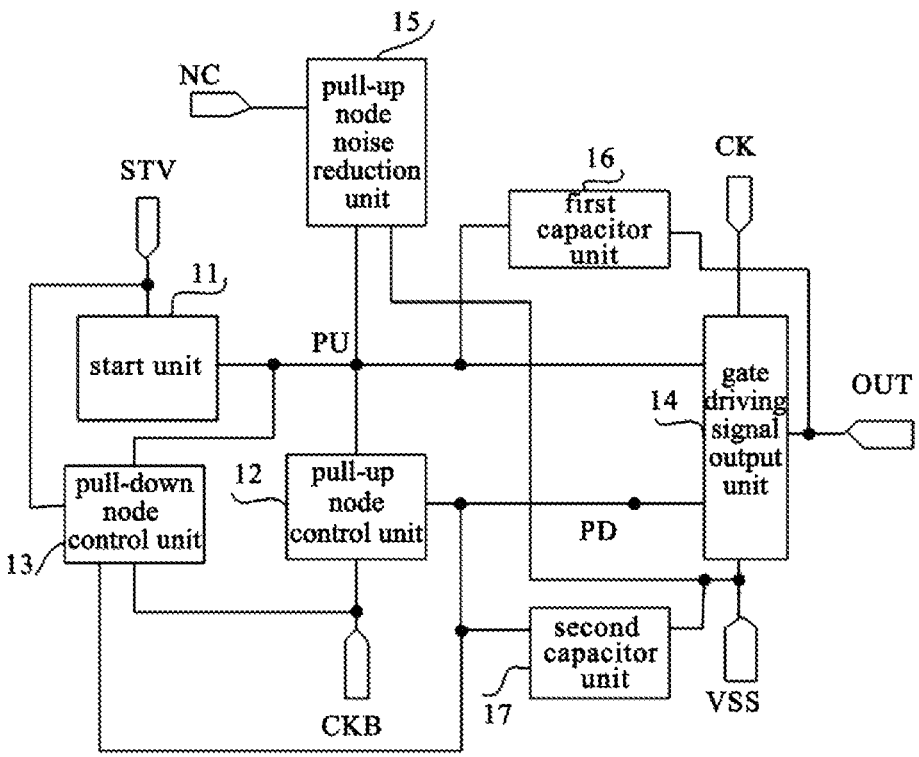
FIG. 2 is another schematic view showing the shift register unit according to some embodiments of the present disclosure.

As shown in FIG. 2, the present disclosure provides in some embodiments a shift register unit which includes: a start unit 11 connected to a start end STV and a pull-up node PU; a pull-up node control unit 12 connected to the pull-up node PU, a first clock signal input end for inputting a first clock signal CKB and a pull-down node PD; a pull-down node control unit 13 connected to the first clock signal input end for inputting the first clock signal CKB, the pull-down node PD, the start end STV and the pull-up node PU; a gate driving signal output unit 14 connected to a second clock signal input end for inputting a second clock signal CK, the pull-up node PU, the pull-down node PD, a low level input end VSS for inputting a low level VSS and a gate driving signal output end OUT; a pull-up node noise reduction unit 15 connected to a noise reduction control end NC, the pull-up node PU and the low level input end for inputting the low level VSS, and configured to control the pull-up node PU to be electrically connected to, or electrically disconnected from, the low level input end under the control of the noise reduction control end NC; and a first capacitor unit 16 connected between the pull-up node PU and the gate driving signal output end OUT.

Figure 1:
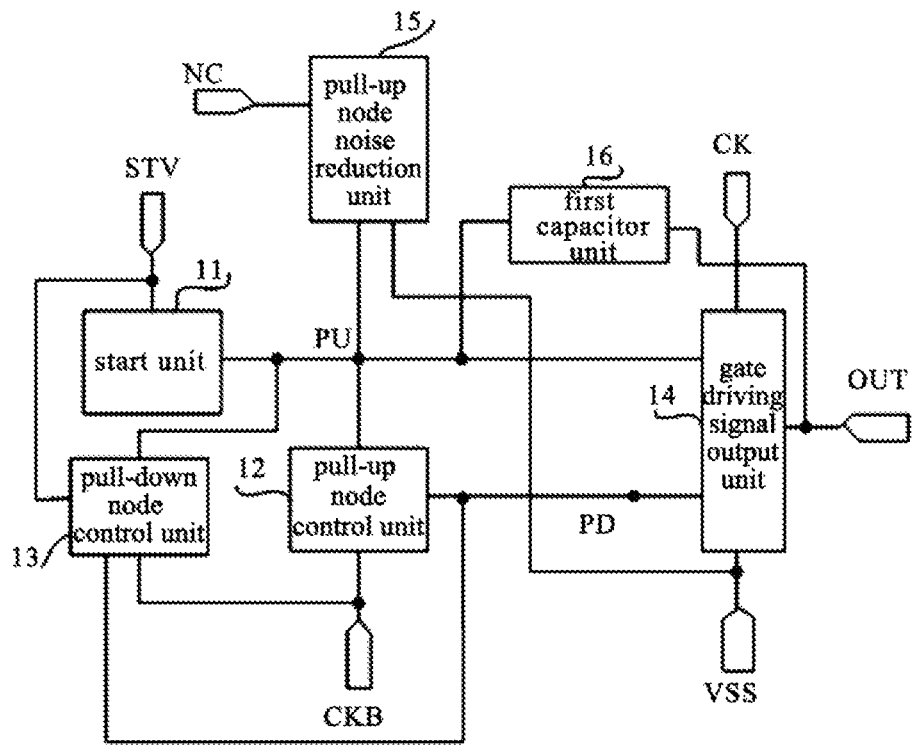
FIG. 1 is a schematic view showing a shift register unit according to some embodiments of the present disclosure.

In FIG. 1, the first capacitor unit 16 is configured to maintain a potential at the pull-up node PU.

According to the shift register unit in the embodiments of the present disclosure, the pull-up node noise reduction unit 15 is adopted so as to control the pull-up node PU to be electrically connected to, or electrically disconnected from, the low level input under the control of the noise reduction control end NC, thereby to perform noise reduction on the pull-up node under the control of the noise reduction control end NC. The shift register unit has such advantages as low noise and excellent stability, so it is able to remarkably increase the yield of panels.

In FIG. 1, a start signal is applied to a next-level shift register unit through the gate driving signal output end OUT.

As shown in FIG. 2, on the basis of the shift register unit in FIG. 1, the shift register unit may further include a second capacitor unit 17 connected between the pull-down node PD and the low level input end for inputting the low level VSS.

The shift register unit in the embodiments of the present disclosure further differs from the conventional shift register unit in that, apart from the first capacitor unit 16, an additional capacitor unit, i.e., the second capacitor unit 17, is connected between the pull-down node PD and the low level input end so as to main a potential at the pull-down node PD.

In actual use, the gate driving signal output unit is configured to control the gate driving signal output end to be electrically connected to the second clock signal input end or the low level input end under the control of the pull-up node and the pull-down node.

In addition, the shift register unit may further include: a start signal output unit connected to the second clock signal input end, the pull-up node, the pull-down node, the low level input end and a start signal output end, and configured to control the start signal output end to be electrically connected to the second clock signal input end or the low level input end under the control of the pull-up node and the pull-down node; and a third capacitor unit connected between the pull-up node and the start signal output end.

Figure 3A:
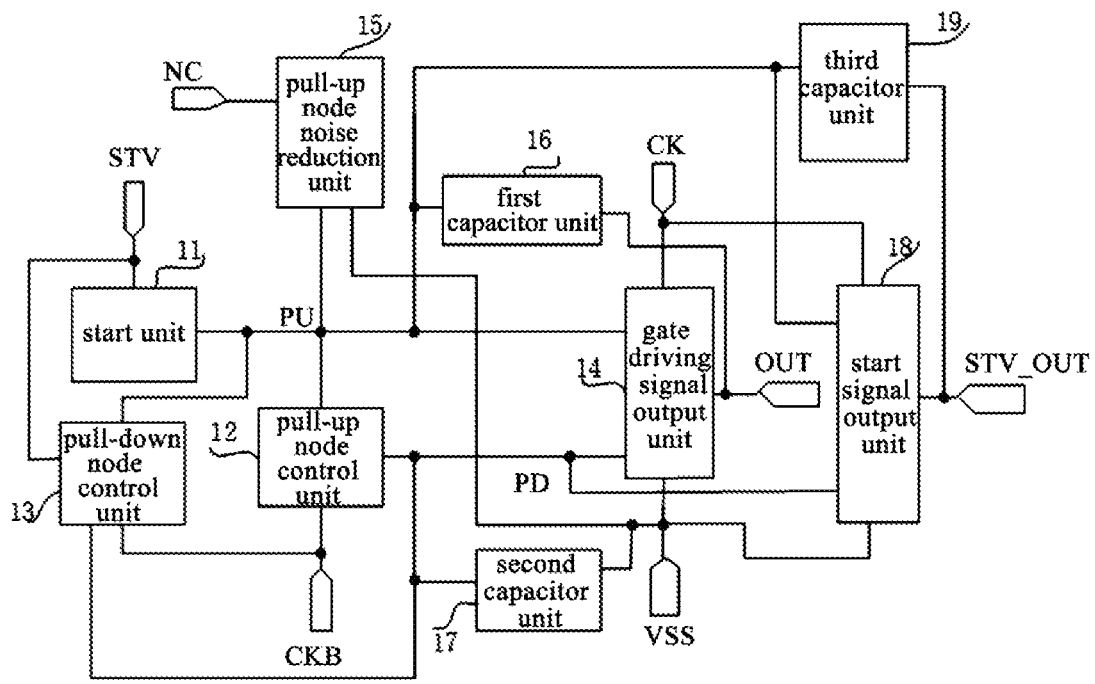
FIG. 3A is yet another schematic view showing the shift register unit according to some embodiments of the present disclosure.

As shown in FIG. 3A, on the basis of the shift register unit in FIG. 2, the shift register unit may further include: the start signal output unit 18 connected to the second clock signal input end for inputting the second clock signal CK, the pull-up node PU, the pull-down node PD, the low level input end for inputting the low level VSS and the start signal output end STV_OUT, and configured to control the start signal output end STV_OUT to be electrically connected to the second clock signal input end and/or the low level input end under the control of the pull-up node PU and the pull-down node PD; and the third capacitor unit 19 connected between the pull-up node PU and the start signal output end STV_OUT.

In FIG. 3A, the additional start signal output unit 18 is provided so as to apply the start signal to the next-level shift register unit, thereby to enhance a driving capability of the shift register unit. The third capacitor unit 19 is configured to further maintain the potential at the pull-up node PU.

Figure 3B:
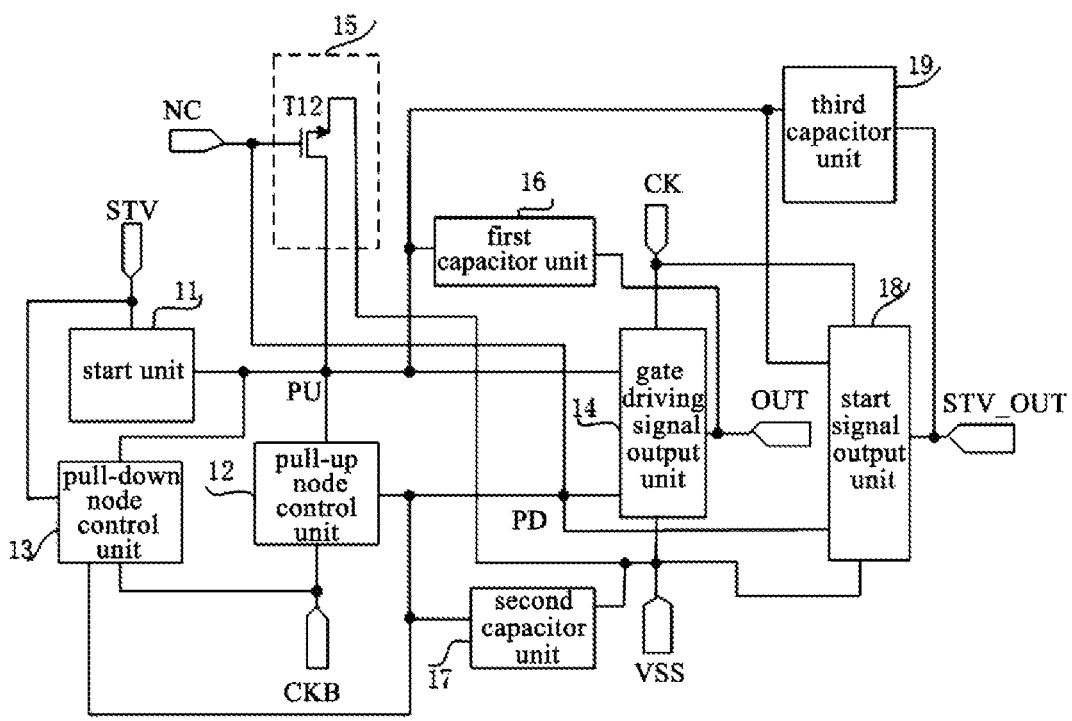
FIG. 3B is still yet another schematic view showing the shift register unit according to some embodiments of the present disclosure.

In some possible embodiments of the present disclosure, as shown in FIG. 3B, on the basis of the shift register unit in FIG. 3A, the noise reduction control end NC may be connected to the pull-down node PD.

The pull-up node noise reduction unit 15 includes a pull-up node noise reduction transistor T12, a gate electrode of which is connected to the noise reduction control end NC, a first electrode of which is connected to the pull-up node PU, and a second electrode of which is connected to the low level input end for inputting the low level VSS. Here, the pull-up node noise reduction transistor T12 may be, but not limited to, an N-type transistor.

In actual use, the noise reduction control end may also be connected to the other ends, as long as the noise reduction control end is capable of outputting a corresponding noise reduction control signal to perform the noise reduction on the pull-up node within a corresponding time period. For example, the noise reduction control end may also be connected to the first clock signal input end.

Figure 10:
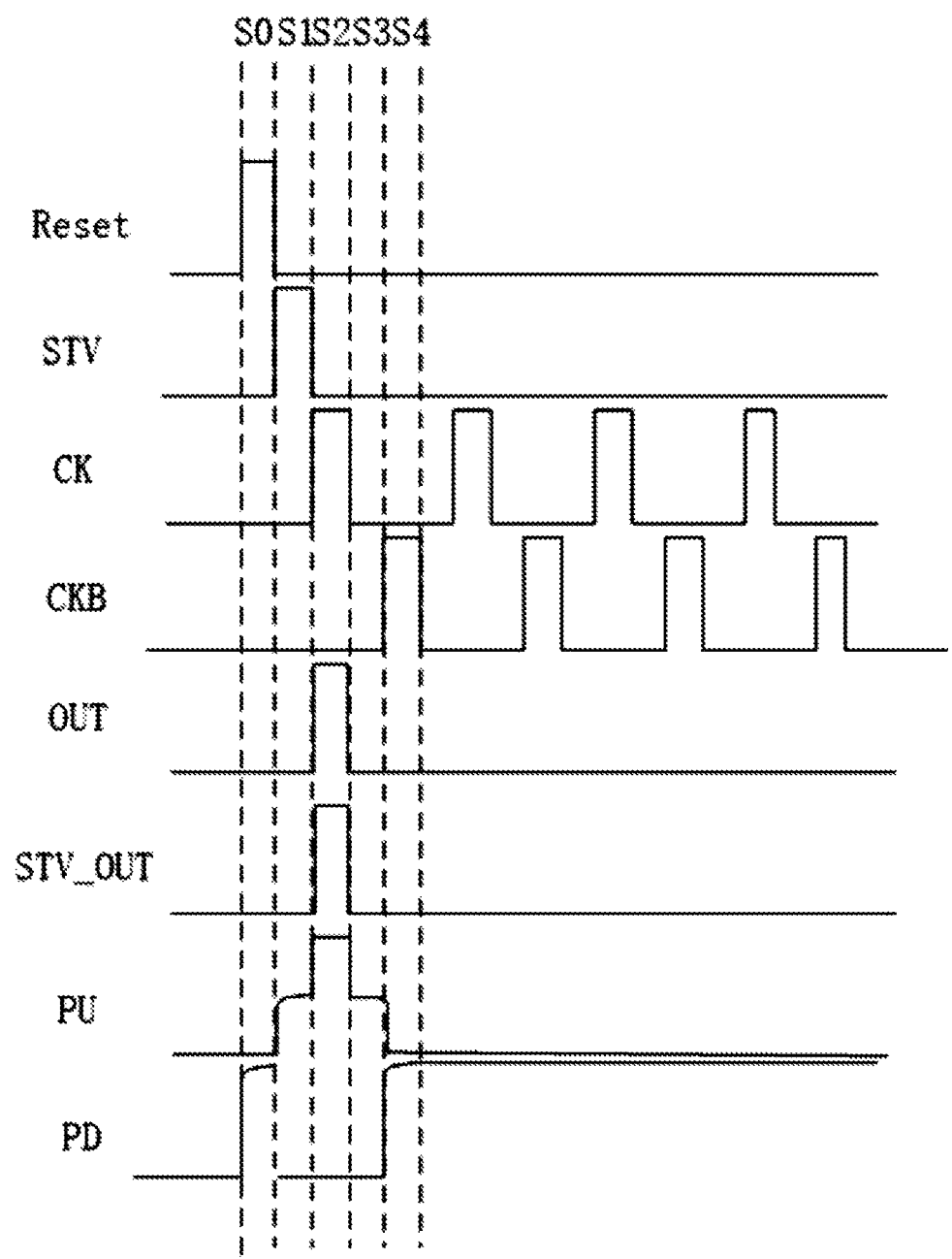
FIG. 10 is a sequence diagram of the shift register unit according to some embodiments of the present disclosure.

In actual use, a period of the first clock signal and a period of the second clock signal may each be T, a duty ratio of each of the first clock signal to the second clock signal may be 1/4, and the second clock signal may be delayed by T/2 relative to the first clock signal, as shown in FIG. 10.

In actual use, the gate driving signal output unit may include: a first gate driving signal output transistor, a gate electrode of which is connected to the pull-up node, a first electrode of which is connected to the second clock signal input end, and a second electrode of which is connected to the gate driving signal output end; and a second gate driving signal output transistor, a gate electrode of which is connected to the pull-down node, a first electrode of which is connected to the gate driving signal output end, and a second electrode of which is connected to the low level input end.

In addition, the start signal output unit may include: a first start signal output transistor, a gate electrode of which is connected to the pull-up node, a first electrode of which is connected to the second clock signal input end, and a second electrode of which is connected to the start signal output end; and a second start signal output transistor, a gate electrode of which is connected to the pull-down node, a first electrode of which is connected to the start signal output end, and a second electrode of which is connected to the low level input end.

In addition, the second capacitor unit may include: a first output capacitor, a first end of which is connected to the gate electrode of the second gate driving signal output transistor, and a second end of which is connected to the low level input end; and a second output capacitor, a first end of which is connected to the gate electrode of the second start signal output transistor, and a second end of which is connected to the low level input end.

Figure 4:
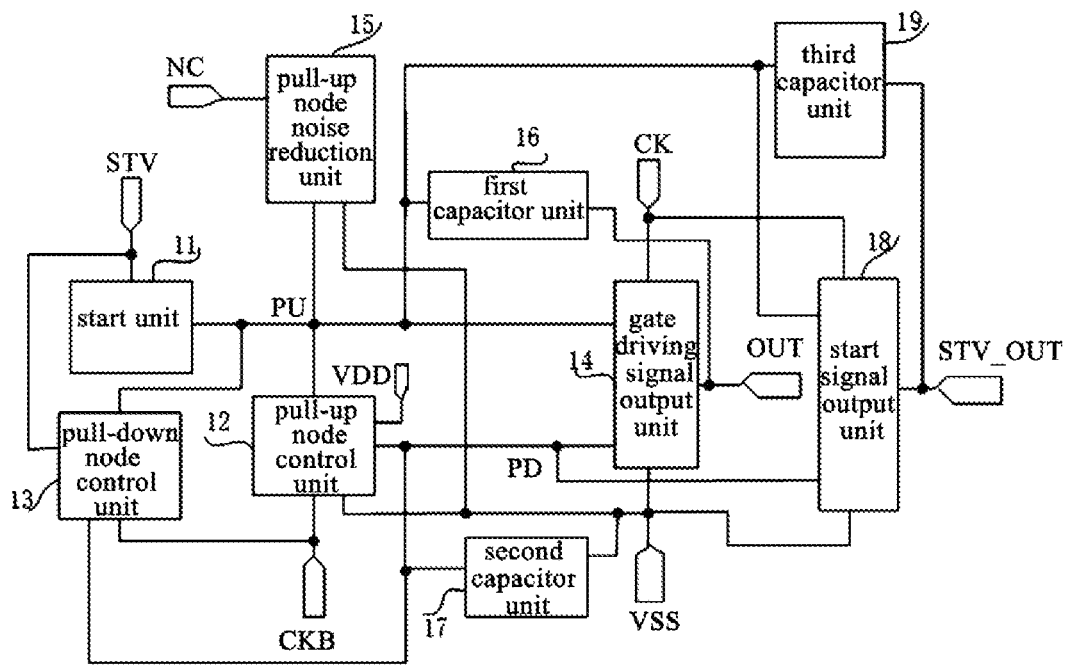
FIG. 4 is still yet another schematic view showing the shift register unit according to some embodiments of the present disclosure.
Figure 5:
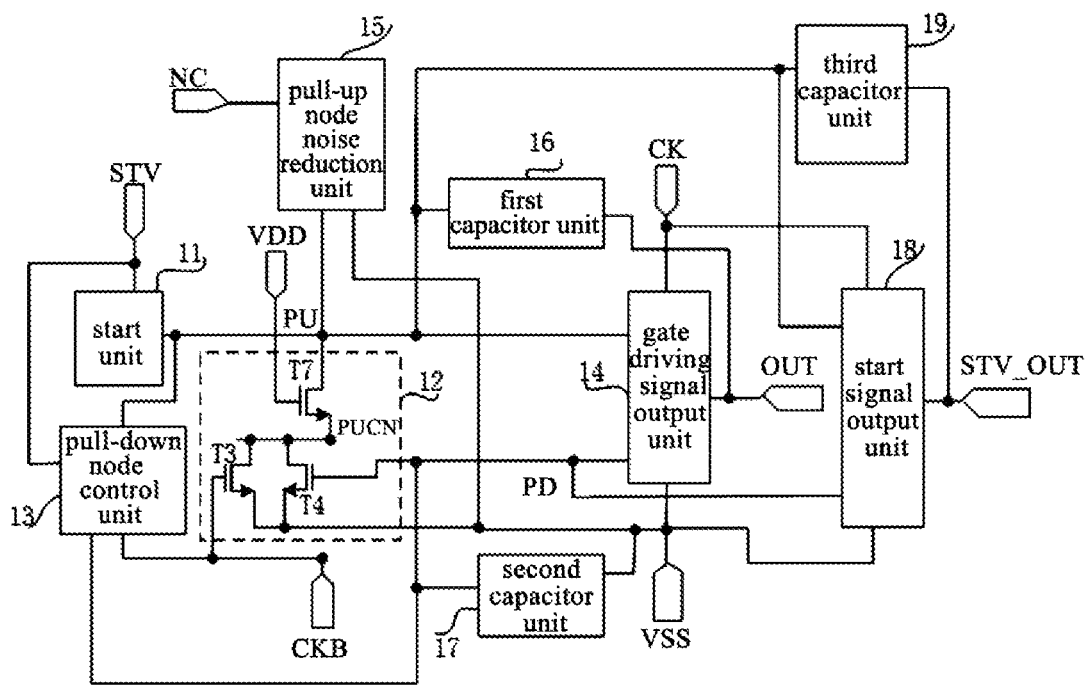
FIG. 5 is still yet another schematic view showing the shift register unit according to some embodiments of the present disclosure.

During the implementation, as shown in FIG. 5, on the basis of the shift register unit in FIG. 3, the pull-up node control unit 12 may include a pull-up control node (not shown in FIG. 4). The pull-up node control unit 12 may be further connected to a high level input end for inputting a high level VDD and the low level input end for inputting the low level VSS, and configured to, when a high level is applied to the first clock signal input end for inputting the first clock signal CKB, control the pull-up control node (not shown in FIG. 4) to be electrically connected to the low level input end for inputting the low level VSS, and when the pull-down node PD is at a high level, control the pull-up control node (not shown in FIG. 4)) to be electrically connected to the low level input end for inputting the low level VSS and control the pull-up control node (not shown in FIG. 4) to be electrically connected to the pull-up node PU under the control of the high level input end for inputting the high level VDD.

In some possible embodiments of the present disclosure, the pull-up node control unit may include: a first pull-up node control transistor, a gate electrode of which is connected to the first clock signal input end, a first electrode of which is connected to the pull-up control node, and a second electrode of which is connected to the low level input end; a second pull-up node control transistor, a gate electrode of which is connected to the pull-down node, a first electrode of which is connected to the pull-up control node, and a second electrode of which is connected to the low level input end; and a third pull-up node control transistor, a gate electrode of which is connected to the high level input end, a first electrode of which is connected to the pull-up node, and a second electrode of which is connected to the pull-up control node.

As shown in FIG. 5, on the basis of the shift register unit in FIG. 4, the pull-up node control unit 12 may include: a first pull-up node control transistor T3, a gate electrode of which is connected to the first clock signal input end for inputting the first clock signal CKB, a drain electrode of which is connected to the pull-up control node PUCN, and a source electrode of which is connected to the low level input end for inputting the low level VSS; a second pull-up node control transistor T4, a gate electrode of which is connected to the pull-down node PD, a drain electrode of which is connected to the pull-up control node PUCN, and a source electrode of which is connected to the low level input end for inputting the low level VSS; and a third pull-up node control transistor T7, a gate electrode of which is connected to the high level input end for inputting the high level VDD, a drain electrode of which is connected to the pull-up node PU, and a source electrode of which is connected to the pull-up control node PUCN.

In FIG. 5, T3, T4 and T7 are all N-type transistors.

During the operation of the shift register unit in FIG. 5, when the first clock signal CKB is at a high level, T3 may be turned on so as to apply the low level VSS to the pull-up control node PUCN. When the first clock signal CKB is at a low level, T3 may be turned off so as to enable the pull-up control node PUCN to be electrically disconnected from the low level input end for inputting the low level VSS. When the pull-down node PD is at a high level, T4 may be turned on so as to apply the low level VSS to the pull-up control node PUCN. When the pull-down node PD is at a low level, T4 may be turned off so as to enable the pull-up control node PUCN to be electrically disconnected from the low level input end for inputting the low level VSS. The high level VDD is applied to the gate electrode of T7, so T7 may be turned on normally, so as to enable the pull-up node PU to be electrically connected to the pull-up control node PUCN.

During the implementation, the start unit may be configured to control the pull-up node to be at a high level when a high level is applied to the start end. The pull-down node control unit may include a pull-down control node. The pull-down node control unit may be further connected to a high level input end and the low level input end, and configured to, when the pull-up node is at a high level, control the pull-down node to be electrically connected to the low level input end, when a high level is applied to the start end, control the pull-down node to be electrically connected to the low level input end, and when a high level is applied to the first clock signal input end, control the pull-down control node to be at a high level and control the pull-down control node to be electrically connected to the pull-down node under the control of the high level input end.

Figure 6:
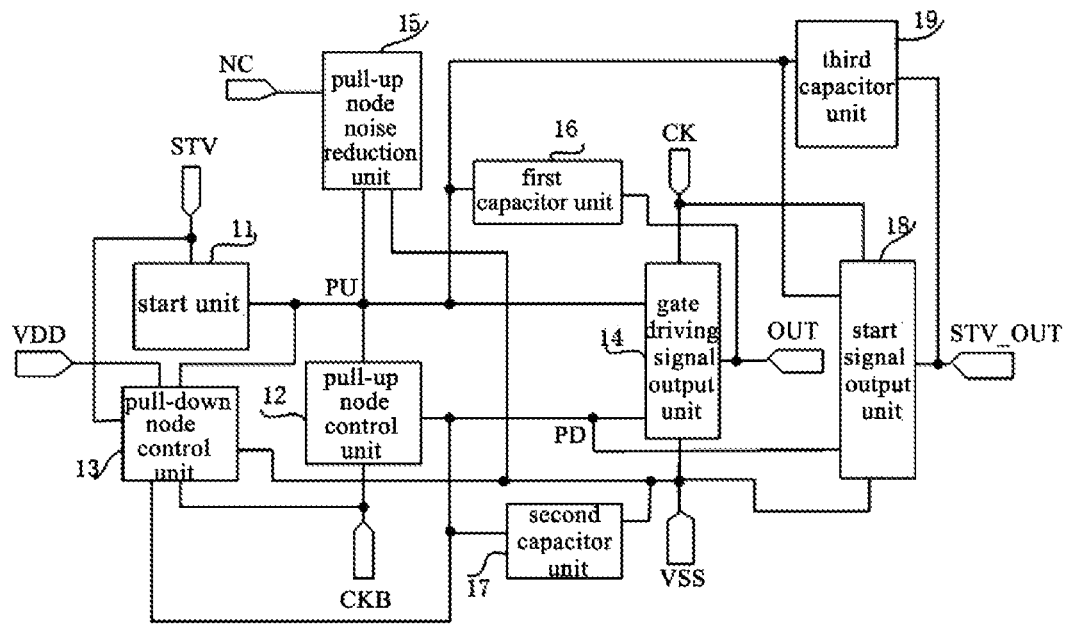
FIG. 6 is still yet another schematic view showing the shift register unit according to some embodiments of the present disclosure.

As shown in FIG. 6, on the basis of the shift register unit in FIG. 3, the start unit 11 is configured to control the pull-up node PU to be at a high level when a high level is applied to the start end STV.

Figure 7:
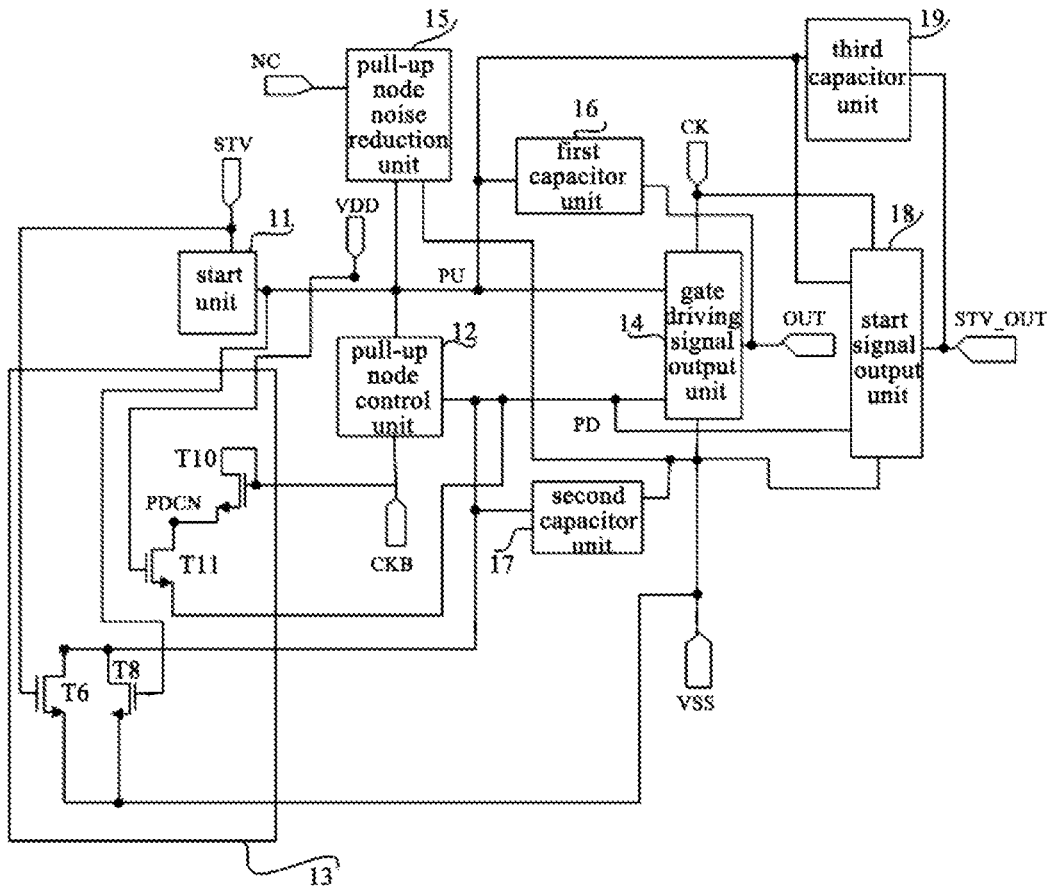
FIG. 7 is still yet another schematic view showing the shift register unit according to some embodiments of the present disclosure.

As shown in FIG. 7, the pull-down node control unit 13 may include a pull-down control node PDCN (not shown in FIG. 6). The pull-down node control unit 13 may be further connected to the high level input end for inputting the high level VDD and the low level input end for inputting the low level VSS, and configured to, when the pull-up node PU is at a high level, control the pull-down node PD to be electrically connected to the low level input end for inputting the low level VSS, when a high level is applied to the start end STV, control the pull-down node PD to be electrically connected to the low level input end for inputting the low level VSS, and when a high level is applied to the first clock signal input end for inputting the first clock signal CKB, control the pull-down control node PDCN (not shown in FIG. 6) to be at a high level and control the pull-down control node PDCN (not shown in FIG. 6) to be electrically connected to the pull-down node PD under the control of the high level input end for inputting the high level VDD.

In some possible embodiments of the present disclosure, the pull-down node control unit may include: a first pull-down node control transistor, a gate electrode of which is connected to the pull-up node, a first electrode of which is connected to the pull-down node, and a second electrode of which is connected to the low level input end; a second pull-down node control transistor, a gate electrode of which is connected to the start end, a first electrode of which is connected to the pull-down node, and a second electrode of which is connected to the low level input end; a third pull-down node control transistor, a gate electrode and a first electrode of which are connected to the first clock signal input end, and a second electrode of which is connected to the pull-down control node; and a fourth pull-down node control transistor, a gate electrode of which is connected to the high level input end, a first electrode of which is connected to the pull-down control node, and a second electrode of which is connected to the pull-down node.

As shown in FIG. 7, on the basis of the shift register unit in FIG. 6, the pull-down node control unit 13 may include: a first pull-down node control transistor T8, a gate electrode of which is connected to the pull-up node PU, a drain electrode of which is connected to the pull-down node PD, and a source electrode of which is connected to the low level input end for inputting the low level VSS; a second pull-down node control transistor T6, a gate electrode of which is connected to the start end STV, a drain electrode of which is connected to the pull-down node PD, and a source electrode of which is connected to the low level input end for inputting the low level VSS; a third pull-down node control transistor T10, a gate electrode and a drain electrode of which are connected to the first clock signal input end for inputting the first clock signal CKB, and a source electrode of which is connected to the pull-down control node PDCN; and a fourth pull-down node control transistor T11, a gate electrode of which is connected to the high level input end VDD, a drain electrode of which is connected to the pull-down control node PDCN, and a source electrode of which is connected to the pull-down node PD.

In FIG. 7, T8, T6, T10 and T11 are all N-type transistors.

During the operation of the shift register unit in FIG. 7, when the pull-up node PU is at a high level, T8 may be turned on so as to apply the low level VSS to the pull-down node PD, and when the pull-up node PU is at a low level, T8 may be turned off so as to enable the pull-down node PD to be electrically disconnected from the low level input end. When a high level is applied to the start end STV, T6 may be turned on so as to apply the low level VSS to the pull-down node PD, and when a low level is applied to the start end STV, T6 may be turned off so as to enable the pull-down node PD to be electrically disconnected from the low level input end. When the first clock signal CKB is at a high level, T10 may be turned on so as to enable the first clock signal input end to be electrically connected to the pull-down control node PDCN, thereby to control the pull-down control node PDCN to be at a high level. When the first clock signal CKB is at a low level, T10 may be turned off so as to enable the first clock signal input end to be electrically disconnected from the pull-down control node PDCN. The gate electrode T11 is connected to the high level input end, so T11 may always be turned on, so as to enable the pull-down control node PDCN to be electrically connected to the pull-down node PD.

Figure 8:
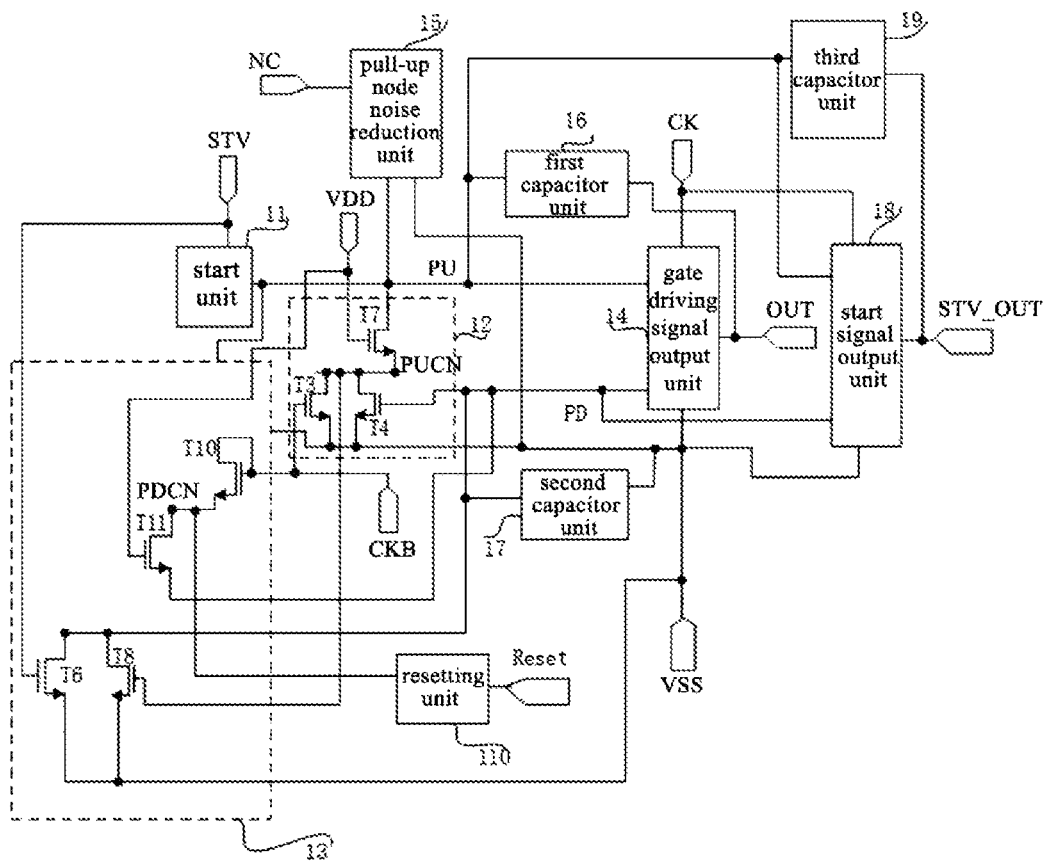
FIG. 8 is still yet another schematic view showing the shift register unit according to some embodiments of the present disclosure.

As shown in FIG. 8, on the basis of the shift register unit in FIG. 7, the shift register unit may further include a resetting unit 110 connected to a resetting end Reset and the pull-down control node PDCN, and configured to control a potential at the pull-down control node PDCN under the control of the resetting end Reset.

In actual use, when it is necessary to control the pull-down node PD to be at a low level, the resetting unit 110 may be controlled through the resetting end Reset, so as to control the potential at the pull-down control node PDCN.

The shift register unit will be described hereinafter in conjunction with a specific embodiment. As shown in FIG. 1 through FIG. 9, the shift register unit includes the start unit, the pull-up node control unit, the pull-down node control unit, the gate driving signal output unit, the pull-up node noise reduction unit, the first capacitor unit, the second capacitor unit, the start signal output unit, the third capacitor unit, the resetting unit, the gate driving signal output end OUT and the start signal output end STV_OUT.

The start unit includes a start transistor T1, a gate electrode and a drain electrode of which are connected to the start end STV, and a source electrode of which is connected to the pull-up control node PUCN. The noise reduction control end includes the pull-down node PD.

The pull-up node noise reduction unit includes a pull-up node noise reduction transistor T12, a gate electrode of which is connected to the pull-down node PD, a drain electrode of which is connected to the pull-up node PU, and a source electrode of which is connected to the low level input end for inputting the low level VSS.

The gate driving signal output unit includes: a first gate driving signal output transistor T13, a gate electrode of which is connected to the pull-up node PU, a drain electrode of which is connected to the second clock signal input end for inputting the second clock signal CK, and a source electrode of which is connected to the gate driving signal output end OUT; and a second gate driving signal output transistor T14, a gate electrode of which is connected to the pull-down node PD, a drain electrode of which is connected to the gate driving signal output end OUT, and a source electrode of which is connected to the low level input end for inputting the low level VSS.

The start signal output unit includes: a first start signal output transistor T15, a gate electrode of which is connected to the pull-up node PU, a drain electrode of which is connected to the second clock signal input end for inputting the second clock signal CK, and a source electrode of which is connected to the start signal output end STV_OUT; and a second start signal output transistor T16, a gate electrode of which is connected to the pull-down node PD, a drain electrode of which is connected to the start signal output end STV_OUT, and a source electrode of which is connected to the low level input end for inputting the low level VSS.

The first capacitor unit includes a storage capacitor C1, a first end of which is connected to the pull-up node PU, and a second end of which is connected to the gate driving signal output end OUT.

The second capacitor unit includes: a first output capacitor C3, a first end of which is connected to the gate electrode of the second gate driving signal output transistor T14, and a second end of which his connected to the low level input end for inputting the low level VSS; and a second output capacitor C4, a first end of which is connected to the gate electrode of the second start signal output transistor T16, and a second end of which is connected to the low level input end for inputting the low level VSS.

The third capacitor unit includes a start capacitor C2, a first end of which is connected to the pull-up node PU, and a second end of which is connected to the start signal output end STV_OUT.

The pull-up node control unit includes: a first pull-up node control transistor T3, a gate electrode of which is connected to the first clock signal input end for inputting the first clock signal CKB, a drain electrode of which is connected to the pull-up control node PUCN, and a source electrode of which is connected to the low level input end for inputting the low level VSS; a second pull-up node control transistor T4, a gate electrode of which is connected to the pull-down node PD, a drain electrode of which is connected to the pull-up control node PUCN, and a source electrode of which is connected to the low level input end for inputting the low level VSS; and a third pull-up node control transistor T7, a gate electrode of which is connected to the high level input end for inputting the high level VDD, a drain electrode of which is connected to the pull-up node PU, and a source electrode of which is connected to the pull-up control node PUCN.

The pull-down node control unit includes: a first pull-down node control transistor T8, a gate electrode of which is connected to the pull-up control node PUCN, a drain electrode of which is connected to the pull-down node PD, and a source electrode of which is connected to the low level input end for inputting the low level VSS; a second pull-down node control transistor T6, a gate electrode of which is connected to the start end STV, a drain electrode of which is connected to the pull-down node PD, and a source electrode of which is connected to the low level input end for inputting the low level VSS; a third pull-down node control transistor T10, a gate electrode and a drain electrode of which are connected to the first clock signal input end for inputting the first clock signal CKB, and a source electrode of which is connected to the pull-down control node PDCN; and a fourth pull-down node control transistor T11, a gate electrode of which is connected to the high level input end for inputting the high level VDD, a drain electrode of which is connected to the pull-down control node PDCN, and a source electrode of which is connected to the pull-down node PD.

The resetting unit includes a resetting transistor T9, a gate electrode and a drain electrode of which are connected to the resetting end Reset, and a source electrode of which is connected to the pull-down control node PDCN.

Figure 9:
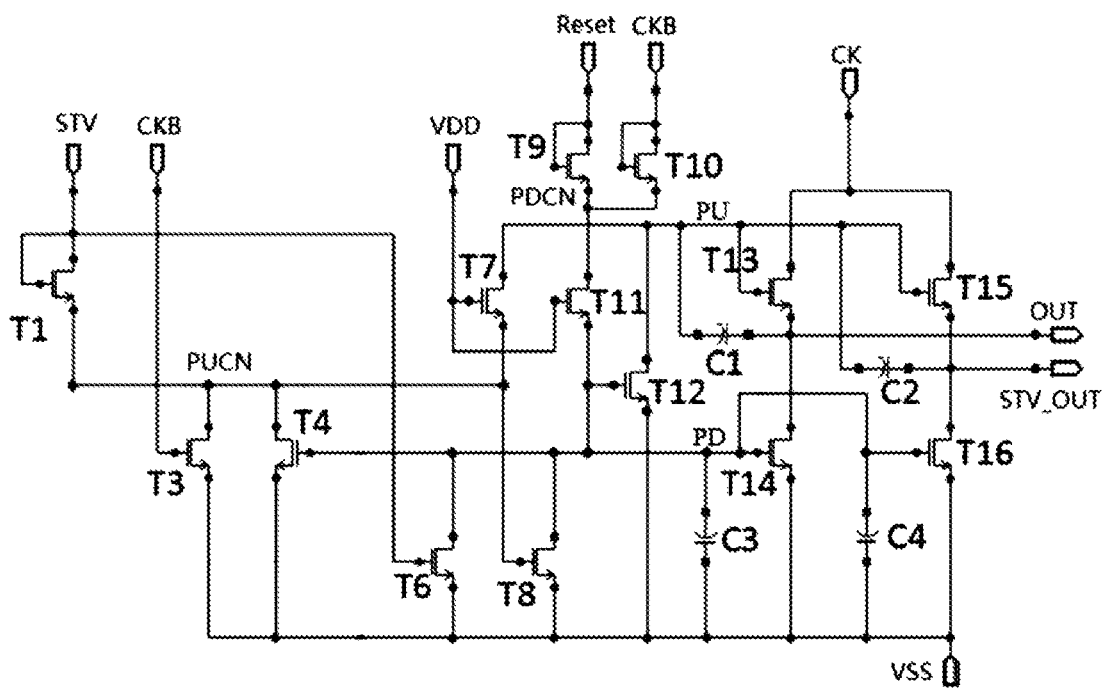
FIG. 9 is a circuit diagram of the shift register unit according to some embodiments of the present disclosure.

In FIG. 9, all the transistors are N-Metal-Oxide-Semiconductor (NMOS) transistors. In actual use, the transistors of the shift register unit may also be P-type transistors, i.e., the types of the transistors will not be particularly defined herein.

In FIG. 9, a resetting signal is inputted through the resetting end Reset, so as to, before a scanning operation within each frame, maintain the resetting end Reset at a high level within a certain time period to reset the shift register unit, and maintain the resetting end Reset at a low level within the remaining time period. T7 and T11 are always turned on. VDD represents a direct current high level signal, VSS represents a direct current low level signal, and STV_OUT is configured to provide a start signal for a next-level shift register unit.

In FIG. 9, the shift register unit includes fourteen NMOS transistors and four capacitors, so as to reduce the noise effectively, thereby to enhance the gate driving performance and the gate driving stability of a display device. The newly-added NMOS transistors in a normally on state (i.e., T7 and T11) are used as single-transistor transmission gates, so as to reduce the noise in a signal path and the noise at the gate driving signal output end, thereby to enhance the lossless transmission of the signal. In addition, through the four capacitors, it is able to apply voltages to the pull-up node PU and the pull-down node PD in a stable and effective manner, thereby to output the gate driving signal in a stable and effective manner.

As shown in FIG. 10, during the operation of the shift register unit in FIG. 9, at a resetting stage S0 of each display period (i.e., within a display period of each frame), a high level is applied to Reset, a low level is applied to STV, and CK and CKB are each at a low level, so as to turn on T9 and T11, thereby to enable PD to be electrically connected to Reset and control PD to be at a high level. T4 is turned on, so as to apply VSS to PUCN. T7 is turned on, so as to enable PU to be electrically connected to PUCN and apply VSS to PU. At this time, T14 and T16 are both turned on, and OUT and STV_OUT each output a low level. Because PD is at a high level, so T12 is turned on, so as to perform noise reduction on PU.

At a first stage S1, a low level is applied to Reset, a high level is applied to STV, and CK and CKB are each at a low level, so as to turn on T1, thereby to enable PUCN to be electrically connected to STV and control PUCN to be at a high level. T7 is turned on, so as to enable STV to charge C1 and C2 through T7, thereby to gradually turn on T13 and T15. The potential at PU is pulled up to a high level, so as to turn on T6 and T8, thereby to pull down the potential at PD to a low level. T13 and T15 are both turned on, and T14 and T16 are both turned off, so as to enable OUT to be electrically connected to the second clock signal input end, thereby to enable each of OUT and STV_OUT to output a low level.

At a second stage S2, a low level is applied to each of Reset and STV, CK is at a high level, and CKB is at a low level. Due to a bootstrapping effect of C1 and C2, the potential at PU is pulled up continuously, so as to turn on T7, thereby to pull up the potential at PUCN to a high level. At this time, T8 is turned on, so as to pull down the potential at PD to a low level. T13 and T15 are both turned on, and T14 and T16 are both turned off, so as to enable OUT to be electrically connected to the second clock signal input end, thereby to enable each of OUT and STV_OUT to output a high level.

At a third stage S3, a low level is applied to each of Reset and STV, and CK and CKB are each at a low level. Because CK is at a low level, the potential at PU is the same as the potential at the first stage S1 but it is still a high level. The potential at PD is still a low level. At this time, T13 and T15 are both turned on, and T14 and T16 are both turned off, so as to enable OUT to be electrically connected to the second clock signal input end, thereby to enable each of OUT and STV_OUT to output a low level.

At a fourth stage S4, a low level is applied to each of Reset and STV, CK is at a low level, and CKB is at a high level, so as to turn on T3, T4, T10 and T12. The potential at PD is pulled up, and the potential at PU is pulled down, so as to perform noise reduction on PU. T13 and T15 are both turned off, and T14 and T16 are both turned on, so as to enable OUT to be electrically connected to the low level input end, thereby to enable each of OUT and STV_OUT to output a low level.

After the second stage S4, CK is at a high level and a low level alternately, and CKB is at a low level and a high level alternately. When CKB is at a high level, T3 is turned on, so as to enable PUCN to be electrically connected to the low level input end for inputting VSS, thereby to maintain the potential at PUCN to be a low level. Because T7 is normally turned on, the potential at PU is also a low level. When CKB is at a high level, T10 is turned on, so as to enable PDCN to be electrically connected to the first clock signal input end for inputting CKB, thereby to maintain the potential at PDCN to be a high level. Because T11 is normally turned on, the potential at PD is a high level. T12 is turned on, so as to enable PU to be electrically connected to the low level input end for inputting VSS, thereby to perform noise reduction on PU.

At the first stage S1, the second stage S2 and the third stage S3, the potential at PD is a low level, and T12 is turned off, so the pull-up node noise reduction unit may control PU to be electrically disconnected from the low level input end for inputting the low level VSS.

According to the shift register unit in FIG. 9, T12 is newly added. When CKB is at a high level, T12 operates as a single-transistor transmission gate, so as to pull down the potential at PU and the potential of the gate driving signal from the gate driving signal output end OUT in a better manner, and perform noise reduction on PU and OUT, thereby to output the gate driving signal in a stable manner.

In the shift register unit in FIG. 9, C1 and C2 each function as to bootstrap the potential at PU, and C3 and C4 each function as to stabilize the potential at PD and reduce the noise generated by PD.

In the shift register unit in FIG. 9, during the operation, T12, as the single-transistor transmission gate, is mainly adopted to transmit a high level. T12 may be an NMOS transistor, by which a certain threshold loss may be caused. In order to reduce the threshold loss, the NMOS transistor may be replaced with a P-Metal-Oxide-Semiconductor (PMOS) single-transistor transmission gate or a Complementary Metal Oxide Semiconductor (CMOS) transmission gate. All the above three types of transmission gates may function as to filter, shape and maintain the signal through a parasitic capacitance generated by the transmission gates.

During the implementation, T12 may be a PMOS transistor. At this time, the gate electrode of T12 may be connected to a third clock signal input end, and a third clock signal may be of a phase reverse to the first clock signal CKB.

When the noise reduction is performed through the CMOS transmission gate including an NMOS transistor and a PMOS transistor, the noise reduction control end may include the first clock signal input end and the third clock signal input end. At this time, the pull-up node noise reduction unit may include: a first pull-up node noise reduction transistor, a gate electrode of which is connected to the first clock signal input end, a first electrode of which is connected to the pull-up node, and a second electrode of which is connected to the low level input end; and a second pull-up node noise reduction transistor, a gate electrode of which is connected to the third clock signal input end, a first electrode of which is connected to the low level input end, and a second electrode of which is connected to the pull-up node. The first pull-up node noise reduction transistor may be an NMOS transistor, and the second pull-up node noise reduction transistor may be a PMOS transistor. The first clock signal from the first clock signal input end may be of a phase reserve to the third clock signal from the third clock signal input end.

When the noise reduction is performed through the CMOS transmission gate including an NMOS transistor and a PMOS transistor, the noise reduction control end may include the pull-down node and the third clock signal input end. The pull-up node noise reduction unit may include: a first pull-up node noise reduction transistor, a gate electrode of which is connected to the pull-down node, a first electrode of which is connected to the pull-up node, and a second electrode of which is connected to the low level input end; and a second pull-up node noise reduction transistor, a gate electrode of which is connected to the third clock signal input end, a first electrode of which is connected to the low level input end, and a second electrode of which is connected to the pull-up node. The first pull-up node noise reduction transistor may be an NMOS transistor, and the second pull-up node noise reduction transistor may be a PMOS transistor. The first clock signal from the first clock signal input end may be of a phase reserve to the third clock signal from the third clock signal input end.

The present disclosure further provides in some embodiments a method for driving the above-mentioned shift register unit, including: at a first stage of each display period, applying a low level to each of a first clock signal input end and a second clock signal input end, controlling, by a start unit, a pull-up node to be electrically connected to a start end under the control of the start end so as to enable the start end to charge a first capacitor unit and enable the pull-up node to be at a high level, controlling, by a pull-down node control unit, a pull-down node to be at a low level under the control of the start end and the pull-up node, controlling, by a gate driving signal output unit, a gate driving signal output end to be electrically connected to the second clock signal end under the control of the pull-up node so as to enable the gate driving signal output end to output a low level, and controlling, by a pull-up node noise reduction unit, the pull-up node to be electrically disconnected from a low level input end under the control of a noise reduction control end; at a second stage of each display period, applying a low level to the first clock signal input end and applying a high level to the second clock signal input end so as to enable the first capacitor unit to pull up a potential at the pull-up node in a bootstrapping manner, controlling, by the pull-down node control unit, the pull-down node to be at a low level continuously under the control of the pull-up node, controlling, by the gate driving signal output unit, the gate driving signal output end to be electrically connected to the second clock signal input end under the control of the pull-up node so as to enable the gate driving signal output end to output a high level, and controlling, by the pull-up node noise reduction unit, the pull-up node to be electrically connected to the low level input end under the control of the noise reduction control end; at a third stage of each display period, applying a low level to each of the first clock signal input end and the second clock signal input end so as to enable the potential at the pull-up node to jump to the high level at the first stage due to the effect of the first capacitor unit, controlling, by the pull-down node control unit, the pull-down node to be at a low level continuously under the control of the pull-up node, controlling, by the gate driving signal output end, the gate driving signal output end to be electrically connected to the second clock signal input end under the control of the pull-up node so as to enable the gate driving signal output end to output a low level, and controlling, by the pull-up node noise reduction unit, the pull-up node to be electrically disconnected from the low level input end under the control of the noise reduction control end; at a fourth stage of each display period, applying a high level to the first clock signal input end and applying a low level to the second clock signal input end, controlling, by the pull-up node control unit, the pull-up node to be at a low level under the control of the first clock signal input end, controlling, by the pull-down node control unit, the pull-down node to be at a high level, controlling, by the gate driving signal output unit, the gate driving signal output end to be electrically connected to the low level input end under the control of the pull-down node, and controlling, by the pull-up node noise reduction unit, the pull-up node to be electrically connected to the low level input end under the control of the noise reduction control end; and after the fourth stage, applying a low level and a high level to the first clock signal input end alternately, when the high level is applied to the first clock signal input end, controlling, by the pull-up node control unit, the pull-up node to be at a low level continuously under the control of the first clock signal input end, controlling, by the pull-down node control unit, the pull-down node to be at a low level continuously, controlling, by the gate driving signal output unit, the gate driving signal output end to be electrically connected to the low level input end under the control of the pull-down node, and controlling, by the pull-up node noise reduction unit, the pull-up node to be electrically connected to the low level input end under the control of the noise reduction control end.

According to the driving method in the embodiments of the present disclosure, through the pull-up node noise reduction unit, it is able to perform noise reduction on the pull-up node at the fourth stage of each display period or at all or parts of the moments after the fourth stage under the control of the noise reduction control end. As a result, it is able to provide the shift register unit with such advantages as low noise and excellent stability, thereby to remarkably increase the yield of panels.

In the driving method, at the first stage, the second stage and the third stage of each display period, the pull-up node noise reduction unit may control the pull-up node to be electrically disconnected from the low level input end for inputting the low level under the control of the noise reduction control end, so as to ensure that the potential at the pull-up node is a high level.

To be specific, when the shift register unit further includes a resetting unit, each display period further includes a resetting stage prior to the first stage. Correspondingly, the method further includes, at the resetting stage, applying a high level to a resetting end, applying a low level to each of the first clock signal input end and the second clock signal input end, controlling, by the resetting unit, the pull-down node to be electrically connected to the resetting end under the control of the resetting end so as to enable the pull-up node to be at a high level, controlling, by the pull-up node control unit, the pull-up node to be at a low level under the control of the pull-down node, controlling, by the gate driving signal output end, the gate driving signal output end to be electrically connected to the second clock signal input end under the control of the pull-up node so as to enable the gate driving signal output end to output a low level, and controlling, by the pull-up node noise reduction unit, the pull-up node to be electrically connected to the low level input end under the control of the noise reduction control end, so as to perform noise reduction on the pull-up node.

To be specific, a period of a first clock signal from the first clock signal input end and a period of a second clock signal from the second clock signal input end are each T, a duty ratio of each of the first clock signal and the second clock signal is 1/4, and the first clock signal is delayed by T/2 relative to the second clock signal, as shown in FIG. 10.

The present disclosure further provides in some embodiments a gate driving circuit including a plurality of the above-mentioned shift register units connected to each other in a cascaded manner. Apart from a first-level shift register unit, a start end of a current-level shift register unit is connected to a gate driving signal output end of a previous-level shift register unit.

The present disclosure further provides in some embodiments a gate driving circuit including a plurality of the above-mentioned shift register units connected to each other in a cascaded manner. Apart from a first-level shift register unit, a start end of a current-level shift register unit is connected to a start signal output end of a previous-level shift register unit.

The present disclosure further provides in some embodiments a display device including the above-mentioned gate driving circuit. The display device may include a liquid crystal display device, e.g., any product or member having a display function such as liquid crystal display, liquid crystal television, digital photo frame, mobile phone or flat-panel computer.

The above embodiments are for illustrative purposes only, but the present disclosure is not limited thereto. Obviously, a person skilled in the art may make further modifications and improvements without departing from the spirit of the present disclosure, and these modifications and improvements shall also fall within the scope of the present disclosure.

What is claimed is:

1. A shift register unit, comprising:
    a start unit connected to a start end and a pull-up node;
    a pull-up node control unit connected to the pull-up node, a first clock signal input end and a pull-down node;
    a pull-down node control unit connected to the first clock signal input end, the pull-down node, the start end and the pull-up node;
    a gate driving signal output unit connected to a second clock signal input end, the pull-up node, the pull-down node, a first level input end and a gate driving signal output end;
    a first capacitor unit connected between the pull-up node and the gate driving signal output end; and
    a pull-up node noise reduction unit connected to a noise reduction control end, the pull-up node and the first level input end, and configured to control the pull-up node to be electrically connected to, or electrically disconnected from, the first level input end under the control of the noise reduction control end.

2. The shift register unit according to claim 1, further comprising a second capacitor unit connected between the pull-down node and the first level input end, and configured to maintain a potential at the pull-down node; and
    the first level input end is the low level input end.

3. The shift register unit according to claim 1, wherein the gate electrode driving signal output unit is configured to control the gate driving signal output end to be electrically connected to the second clock signal input end or the first level input end under the control of the pull-up node and the pull-down node,
    wherein the shift register unit further comprises:
    a start signal output unit connected to the second clock signal input end, the pull-up node, the pull-down node, the first level input end and a start signal output end, and configured to control the start signal output end to be electrically connected to the second clock signal input end or the first level input end under the control of the pull-up node and the pull-down node; and
    a third capacitor unit connected between the pull-up node and the start signal output end.

4. The shift register unit according to claim 3, wherein the gate driving signal output unit comprises:
    a first gate driving signal output transistor, a gate electrode of which is connected to the pull-up node, a first electrode of which is connected to the second clock signal input end, and a second electrode of which is connected to the gate driving signal output end; and
    a second gate driving signal output transistor, a gate electrode of which is connected to the pull-down node, a first electrode of which is connected to the gate driving signal output end, and a second electrode of which is connected to the first level input end,
    wherein the start signal output unit comprises:
    a first start signal output transistor, a gate electrode of which is connected to the pull-up node, a first electrode of which is connected to the second clock signal input end, and a second electrode of which is connected to the start signal output end; and
    a second start signal output transistor, a gate electrode of which is connected to the pull-down node, a first electrode of which is connected to the start signal output end, and a second electrode of which is connected to the first level input end,
    wherein the second capacitor unit comprises:
    a first output capacitor, a first end of which is connected to the gate electrode of the second gate driving signal output transistor, and a second end of which is connected to the first level input end; and
    a second output capacitor, a first end of which is connected to the gate electrode of the second start signal output transistor, and a second end of which is connected to the first level input end.

5. A gate driving circuit, comprising:
    a plurality of the shift register units according to claim 3 connected to each other in a cascaded manner, wherein apart from a first-level shift register unit, a start end of a current-level shift register unit is connected to connected to a start signal output end of the previous-level shift register unit.

6. The gate driving circuit according to claim 5, further comprising a second capacitor unit connected between the pull-down node and the first level input end, and configured to maintain a potential at the pull-down node.

7. The gate driving circuit according to claim 5, wherein the gate electrode driving signal output unit is configured to control the gate driving signal output end to be electrically connected to the second clock signal input end or the first level input end under the control of the pull-up node and the pull-down node,
    wherein the shift register unit further comprises:
    a start signal output unit connected to the second clock signal input end, the pull-up node, the pull-down node, the first level input end and a start signal output end, and configured to control the start signal output end to be electrically connected to the second clock signal input end or the first level input end under the control of the pull-up node and the pull-down node; and
    a third capacitor unit connected between the pull-up node and the start signal output end.

8. The shift register unit according to claim 1, wherein the noise reduction control end is connected to the pull-down node, and the pull-up node noise reduction unit comprises a pull-up node noise reduction transistor, a gate electrode of which is connected to the noise reduction control end, a first electrode of which is connected to the pull-up node, and a second electrode of which is connected to the first level input end.

9. The shift register unit according to claim 1, wherein the pull-up node control unit is further connected to a second level input end and the first level input end, and configured to, when a second level is applied to the first clock signal input end, control a pull-up control node to be electrically connected to the first level input end, and when the pull-down node is at a second level, control the pull-up control node to be electrically connected to the first level input end and control the pull-up control node to be electrically connected to the pull-up node under the control of the second level input end; and
    the second level input end is the high level input end.

10. The shift register unit according to claim 9, wherein the pull-up node control unit comprises:
- a first pull-up node control transistor, a gate electrode of which is connected to the first clock signal input end, a first electrode of which is connected to the pull-up control node, and a second electrode of which is connected to the first level input end;
- a second pull-up node control transistor, a gate electrode of which is connected to the pull-down node, a first electrode of which is connected to the pull-up control node, and a second electrode of which is connected to the first level input end; and
- a third pull-up node control transistor, a gate electrode of which is connected to the second level input end, a first electrode of which is connected to the pull-up node, and a second electrode of which is connected to the pull-up control node.

11. The shift register unit according to claim 1, wherein the start unit is configured to control the pull-up node to be at a second level when a second level is applied to the start end, and the pull-down node control unit comprises a pull-down control node,
wherein the pull-down node control unit is further connected to a second level input end and the first level input end, and configured to, when the pull-up node is at a second level, control the pull-down node to be electrically connected to the first level input end, when a second level is applied to the start end, control the pull-down node to be electrically connected to the first level input end, and when a second level is applied to the first clock signal input end, control the pull-down control node to be at a second level and control the pull-down control node to be electrically connected to the pull-down node under the control of the second level input end.

12. The shift register unit according to claim 11, wherein the pull-down node control unit comprises:
- a first pull-down node control transistor, a gate electrode of which is connected to the pull-up control node, a first electrode of which is connected to the pull-down node, and a second electrode of which is connected to the first level input end;
- a second pull-down node control transistor, a gate electrode of which is connected to the start end, a first electrode of which is connected to the pull-down node, and a second electrode of which is connected to the first level input end;
- a third pull-down node control transistor, a gate electrode and a first electrode of which are connected to the first clock signal input end, and a second electrode of which is connected to the pull-down control node; and
- a fourth pull-down node control transistor, a gate electrode of which is connected to the second level input end, a first electrode of which is connected to the pull-down control node, and a second electrode of which is connected to the pull-down node.

13. The shift register unit according to claim 11, further comprising a resetting unit connected to a resetting end and the pull-down control node, and configured to control a potential at the pull-down control node under the control of the resetting end.

14. A method for driving the shift register unit according to claim 1, comprising:
- at a first stage of each display period, applying a first level to each of a first clock signal input end and a second clock signal input end, controlling, by a start unit, a pull-up node to be electrically connected to a start end under the control of the start end so as to enable the start end to charge a first capacitor unit and enable the pull-up node to be at a second level, controlling, by a pull-down node control unit, a pull-down node to be at a first level under the control of the start end and the pull-up node, controlling, by a gate driving signal output unit, a gate driving signal output end to be electrically connected to the second clock signal end under the control of the pull-up node so as to enable the gate driving signal output end to output a first level, and controlling, by a pull-up node noise reduction unit, the pull-up node to be electrically disconnected from a first level input end under the control of a noise reduction control end;
- at a second stage of each display period, applying a first level to the first clock signal input end and applying a second level to the second clock signal input end so as to enable the first capacitor unit to pull up a potential at the pull-up node in a bootstrapping manner, controlling, by the pull-down node control unit, the pull-down node to be at a first level continuously under the control of the pull-up node, controlling, by the gate driving signal output unit, the gate driving signal output end to be electrically connected to the second clock signal input end under the control of the pull-up node so as to enable the gate driving signal output end to output a second level, and controlling, by the pull-up node noise reduction unit, the pull-up node to be electrically connected to the first level input end under the control of the noise reduction control end;
- at a third stage of each display period, applying a first level to each of the first clock signal input end and the second clock signal input end so as to enable the potential at the pull-up node to jump to the second level at the first stage due to the effect of the first capacitor unit, controlling, by the pull-down node control unit, the pull-down node to be at a first level continuously under the control of the pull-up node, controlling, by the gate driving signal output end, the gate driving signal output end to be electrically connected to the second clock signal input end under the control of the pull-up node so as to enable the gate driving signal output end to output a first level, and controlling, by the pull-up node noise reduction unit, the pull-up node to be electrically disconnected from the first level input end under the control of the noise reduction control end;
- at a fourth stage of each display period, applying a second level to the first clock signal input end and applying a first level to the second clock signal input end, controlling, by the pull-up node control unit, the pull-up node to be at a first level under the control of the first clock signal input end, controlling, by the pull-down node control unit, the pull-down node to be at a second level, controlling, by the gate driving signal output unit, the gate driving signal output end to be electrically connected to the first level input end under the control of the pull-down node, and controlling, by the pull-up node noise reduction unit, the pull-up node to be electrically connected to the first level input end under the control of the noise reduction control end; and
- after the fourth stage, applying a first level and a second level to the first clock signal input end alternately, when the second level is applied to the first clock signal input end, controlling, by the pull-up node control unit, the pull-up node to be at a first level continuously under the control of the first clock signal input end, controlling, by the pull-down node control unit, the pull-down node to be at a first level continuously, controlling, by the gate driving signal output unit, the gate driving signal output end to be electrically connected to the first level input end under the control of the pull-down node, and controlling, by the pull-up node noise reduction unit, the pull-up node to be electrically connected to the first level input end under the control of the noise reduction control end.

15. The method according to claim 14, wherein when the shift register unit further includes a resetting unit, each display period further comprises a resetting stage prior to the first stage,
    wherein the method further comprises, at the resetting stage, applying a second level to a resetting end, applying a first level to each of the first clock signal input end and the second clock signal input end, controlling, by the resetting unit, the pull-down node to be electrically connected to the resetting end under the control of the resetting end so as to enable the pull-up node to be at a second level, controlling, by the pull-up node control unit, the pull-up node to be at a first level under the control of the pull-down node, controlling, by the gate driving signal output end, the gate driving signal output end to be electrically connected to the second clock signal input end under the control of the pull-up node so as to enable the gate driving signal output end to output a first level, and controlling, by the pull-up node noise reduction unit, the pull-up node to be electrically connected to the first level input end under the control of the noise reduction control end.

16. The method according to claim 14, wherein a period of a first clock signal from the first clock signal input end and a period of a second clock signal from the second clock signal input end are each T, a duty ratio of each of the first clock signal and the second clock signal is 1/4, and the first clock signal is delayed by T/2 relative to the second clock signal.

17. A gate driving circuit, comprising:
    a plurality of the shift register units according to claim 1 connected to each other in a cascaded manner, wherein apart from a first-level shift register unit, a start end of a current-level shift register unit is connected to a gate driving signal output end of a previous-level shift register unit.

18. A display device, comprising the gate driving circuit according to claim 17.

19. The gate driving circuit according to claim 17, further comprising a second capacitor unit connected between the pull-down node and the first level input end, and configured to maintain a potential at the pull-down node.

20. The gate driving circuit according to claim 17, wherein the gate electrode driving signal output unit is configured to control the gate driving signal output end to be electrically connected to the second clock signal input end or the first level input end under the control of the pull-up node and the pull-down node,
    wherein the shift register unit further comprises:
    a start signal output unit connected to the second clock signal input end, the pull-up node, the pull-down node, the first level input end and a start signal output end, and configured to control the start signal output end to be electrically connected to the second clock signal input end or the first level input end under the control of the pull-up node and the pull-down node; and
    a third capacitor unit connected between the pull-up node and the start signal output end.

* * * * *